US008617774B2

United States Patent
Kerwien et al.

(10) Patent No.: US 8,617,774 B2
(45) Date of Patent: Dec. 31, 2013

(54) METHOD AND CALIBRATION MASK FOR CALIBRATING A POSITION MEASURING APPARATUS

(75) Inventors: Norbert Kerwien, Moegglingen (DE); Jochen Hetzler, Aalen (DE)

(73) Assignee: Carl Zeiss SMS GmbH, Jena (DE)

( * ) Notice: Subject to any disclaimer, the term of this patent is extended or adjusted under 35 U.S.C. 154(b) by 73 days.

(21) Appl. No.: 13/266,920

(22) PCT Filed: Apr. 10, 2010

(86) PCT No.: PCT/EP2010/002236
§ 371 (c)(1),
(2), (4) Date: Mar. 19, 2012

(87) PCT Pub. No.: WO2010/124791
PCT Pub. Date: Nov. 4, 2010

(65) Prior Publication Data
US 2012/0160007 A1    Jun. 28, 2012

Related U.S. Application Data

(60) Provisional application No. 61/173,612, filed on Apr. 29, 2009.

(30) Foreign Application Priority Data

Apr. 29, 2009 (DE) .......................... 10 2009 019 140

(51) Int. Cl.
G03F 9/00 (2006.01)
G03F 1/44 (2012.01)
(52) U.S. Cl.
USPC ............... 430/30; 430/5; 430/22; 73/1.79; 257/48; 257/797; 356/399
(58) Field of Classification Search
USPC ................. 430/5, 22, 30; 73/1.79; 356/399; 257/48, 797
See application file for complete search history.

(56) References Cited

U.S. PATENT DOCUMENTS

| | | | |
|---|---|---|---|
| 3,690,881 A | 9/1972 | King | |
| 6,940,607 B2 | 9/2005 | Freimann et al. | |
| 7,023,562 B2 | 4/2006 | De Lega | |
| 7,024,066 B1 | 4/2006 | Malendevich et al. | |
| 7,062,397 B1 | 6/2006 | Minor | |
| 7,081,962 B2 | 7/2006 | Nakauchi | |
| 7,247,843 B1 | 7/2007 | Moon | |
| 7,361,941 B1 | 4/2008 | Lorusso et al. | |
| 2005/0084778 A1 | 4/2005 | Yu | |
| 2005/0248740 A1 | 11/2005 | Veen et al. | |
| 2005/0275848 A1 | 12/2005 | Hill | |
| 2006/0023178 A1 | 2/2006 | Loopstra et al. | |
| 2006/0126058 A1 | 6/2006 | Nimmakayala et al. | |
| 2008/0043247 A1 | 2/2008 | Arnold et al. | |
| 2010/0153059 A1 | 6/2010 | Klose et al. | |

FOREIGN PATENT DOCUMENTS

| | | | |
|---|---|---|---|
| CN | 1728002 | 2/2006 | ............... G03F 9/00 |
| DE | 102006032053 A1 | 10/2009 | |
| EP | 161933 A2 | 11/2005 | |
| EP | 1 621 933 | 1/2006 | ............... G03F 7/20 |
| EP | 1278104 B1 | 6/2007 | |
| JP | 2005-252281 | 9/2005 | ........... H01L 21/027 |
| WO | WO03/071471 | 8/2003 | |
| WO | WO2009/006914 | 1/2009 | |
| WO | WO2009/007087 | 1/2009 | |

OTHER PUBLICATIONS

Klose et al, "High-resolution and high-precision pattern placement metrology for the 45nm node and beyond", published at the 24th European Mask and Lithography Conference Dresden, Jan. 2008.
Schlueter et al, "Next generation mask metrology tool", Photomask and Next-Generation Lithography Mask Technology IX, Proceedings of SPIE vol. 4754, 758-768 (2002).
M. Born, E. Wolf, "Principles of Optics", Jan. 1, 1989, Pergamon Press, Oxford, p. 412.
English translation of Chinese Office Action for Application 2010800189812 dated Jul. 10, 2013 (7 pages).
International Search Report for International Application PCT/EP2010/002236 dated Apr. 29, 2009 (4 pages).
Written Opinion of the International Searching Authority for International Application PCT/EP2011/002236 dated Apr. 29, 2009 (6 pages).

*Primary Examiner* — Christopher Young
(74) *Attorney, Agent, or Firm* — Fish & Richardson P.C.

(57) ABSTRACT

A method for calibrating an apparatus for the position measurement of measurement structures on a lithography mask comprises the following steps: qualifying a calibration mask comprising diffractive structures arranged thereon by determining positions of the diffractive structures with respect to one another by means of interferometric measurement, determining positions of measurement structures arranged on the calibration mask with respect to one another by means of the apparatus, and calibrating the apparatus by means of the positions determined for the measurement structures and also the positions determined for the diffractive structures.

33 Claims, 5 Drawing Sheets

METHOD AND CALIBRATION MASK FOR CALIBRATING A POSITION MEASURING APPARATUS

CROSS-REFERENCE TO RELATED APPLICATIONS

This application is the National Stage of International Application PCT/EP2010/002236, filed on Apr. 10, 2010, which claims priority to German Application 10 2009 019 140.2, filed on Apr. 29, 2009, and U.S. Provisional Patent Application 61/173,612, filed on Apr. 29, 2009. The contents of the above applications are herein incorporated by reference in their entirety.

BACKGROUND OF THE INVENTION

The invention relates to a method for calibrating an apparatus for the position measurement of measurement structures on a lithography mask, also referred to hereinafter as position measuring apparatus, a calibration mask for calibrating an apparatus of this type, and also a calibration mask set comprising calibration masks of this type. Furthermore, the invention relates to an arrangement comprising an apparatus for position measurement and also a calibration mask of this type, a use of a calibration mask of this type, and also a method for measuring a mask for microlithography.

The highly accurate position measurement of measurement structures, such as alignment marks, for instance, on a lithography mask is among the central tasks of mask metrology. It is also referred to as photomask pattern placement (PPPM). By means of the measurement of the measurement structures, the material measure on the mask is generated with a high accuracy. It is an essential prerequisite for enabling the positional accuracy of the structures on the mask at all in the mask writing process using electron beam writers. Furthermore, the measurement of the measurement structures of an existing mask set makes it possible to qualify the deviation of the structure positions of the different masks for the individual lithographic layers with respect to one another. This deviation of the structure positions from mask to mask is also referred to as "overlay". Masks in the sense mentioned above are often also referred to as reticles.

As the mask structures shrink from technology node to technology node, the requirements made of the position measurement of the mask structures also increase continuously. As a result of technologies such as double patterning, the requirements made of the mask-to-mask overlay and thus of the structure positioning increase significantly in addition to that. Since the individual masks of a mask set are increasingly being produced by different mask manufacturing firms, often spread throughout the world, and measured by means of different position measuring apparatuses, also referred to as "registration apparatuses", the coordination of the individual position measuring apparatuses with respect to one another is acquiring ever increasing importance.

The position determination on lithography masks is conventionally based exclusively on an interferometric length measurement. For this purpose, alignment marks of a mask are detected individually with regard to their position by means of a microscopic image. By means of a positioning table, the individual alignment marks of the mask are successively moved into the center of the image field and the position of the respective alignment mark is determined by means of edge threshold values or by means of correlation methods. The distance from the previously measured alignment mark is thereupon determined by determining the distance covered by the positioning table between the measurements. The distance covered by the positioning table is determined by means of interferometric length measurement.

The calibration of position measuring apparatuses is conventionally effected by means of self-consistency tests. In this case, a calibration mask is measured in different insertion positions and rotational positions. From the quasi-redundant measurement data record, position errors of the alignment marks on the calibration mask can be separated from inherent errors of the position measuring apparatus. The latter are used in turn for calibrating the position measuring apparatus.

Typical causes of errors of the position measuring apparatus are, inter alia, interferometer errors and also tilting and unevennesses of the interferometer mirrors. Although such errors can be taken into account by calibration methods described above, such methods nevertheless remain bound to the measurement at the position measuring apparatus itself. This leads, in particular, to the problems presented below.

Each calibration method on the abovementioned basis is blind to specific types of error intrinsic to it. Thus, specific classes of errors cannot be detected and separated by a simple calibration measurement. Examples of the causes of such errors are, inter alia: mirror unevennesses with spatial frequencies greater than the calibration raster resulting from the different insertion positions, incorrect positions of the mask, image field rotation, unevennesses of the mask, etc.

This problem is conventionally combated by increasing the redundancy of the measurements. However, this significantly increases the measurement outlay. The measurement outlay for the calibration thus increases with the accuracy requirements and the calibration quality.

By matching the individual position measuring apparatuses of the same type to one another, failures of individual machines can be registered. Systematic errors which are inherent to the method and inherent to the machine type are not identified, however.

Underlying Object

It is an object of the invention to solve the abovementioned problems and, in particular, to provide a calibration method and also a calibration mask which can be used to calibrate an apparatus for the position measurement of measurement structures on a lithography mask with improved accuracy.

Solution According to the Invention

The invention provides a method for calibrating an apparatus for the position measurement of measurement structures on a lithography mask. The calibration method according to the invention comprises the following steps: qualifying a calibration mask comprising diffractive structures arranged thereon by determining positions of the diffractive structures with respect to one another by means of interferometric measurement, determining positions of measurement structures arranged on the calibration mask with respect to one another by means of the apparatus, and calibrating the apparatus by means of the positions determined for the measurement structures and also the positions determined for the diffractive structures. A calibration mask within the meaning of this application does not have to serve exclusively for the calibration of the apparatus. As explained in greater detail below, in accordance with one embodiment, a product mask or useful mask provided with corresponding diffractive structures can also serve as a calibration mask. In accordance with another embodiment, the calibration mask serves only for the calibration of the apparatus and comprises no product structures to be imaged onto a wafer.

Dedicated alignment marks or else useful structures or product structures to be imaged onto a wafer can serve as measurement structures within the meaning of this application. In one embodiment, the measurement structures can also be contained as so-called "in-die structures" on the lithography mask.

The invention furthermore provides a calibration mask for calibrating an apparatus for the position measurement of measurement structures on a lithography mask. The calibration mask according to the invention comprises diffractive structures configured for the interferometric position measurement of the diffractive structures. In particular, the diffractive structures of the calibration mask are configured for enabling a measurement of the positions of the diffractive structures by means of wavefront detection. Furthermore, the invention provides an arrangement comprising an apparatus for the position measurement of measurement structures on a lithography mask and also a calibration mask of this type.

The invention furthermore proposes a use of a calibration mask comprising diffractive structures arranged thereon for the calibration of an apparatus for the position measurement of measurement structures on a lithography mask. Said diffractive structures are configured for the interferometric position measurement of the diffractive structures.

In other words, the invention provides a calibration method for calibrating a so-called "registration apparatus". A "registration apparatus" of this type serves for the position measurement of measurement structures on a mask for microlithography, that is to say a mask which is provided for being imaged onto a semiconductor wafer in a projection exposure apparatus for microlithography. A first step of the calibration method according to the invention involves providing a calibration mask having diffractive structures arranged thereon. The diffractive structures are configured in such a way that the positions of the diffractive structures can be determined by interferometric measurement of said diffractive structures. The distance between the diffractive structures can be very small or even become zero, with the result that the individual diffractive structures merge into one another.

After such interferometric determination of the positions of the diffractive structures with respect to one another, the positions of measurement structures arranged on the calibration mask are determined by means of the position measuring apparatus. The measurement structures can be arranged in addition to the diffractive structures on the calibration mask. As an alternative, the diffractive structures themselves can also function as measurement structures. The position data record generated by means of the interferometric measurement and also the position data record determined by means of the position measuring apparatus are thereupon used to calibrate the position measuring apparatus.

The interferometric position determination of the diffractive structures according to the invention can thus be ascribed, in particular, to an areal position measurement on the calibration mask by wavefront measurement. A position measurement accuracy of the diffractive structures of better than 2 nm, in particular better than 1 nm, 0.5 nm or 0.1 nm, can be obtained by means of such a wavefront measurement. The method according to the invention thus provides a reference method having high absolute accuracy; in addition, the method is based on a completely different measurement principle in comparison with the measurement—employed in conventional calibration methods—of the measurement structures by image detection and interferometric length measurement. The use of such a different measurement method enables error separation, whereby the absolute accuracy of the calibration of the position measuring apparatus can be increased.

In one embodiment of the calibration method according to the invention, when qualifying the calibration mask, a measurement wave of an interferometer is radiated onto the calibration mask in such a way that it is reflected in Littrow reflection at the diffractive structures, and the reflected wave is superimposed with a reference wave for generating an interference pattern. The measurement wave can be configured as a plane wave. In the case of a Littrow reflection, the diffractive structures are oriented with respect to the measurement wave in such a way that the wave reflected at the diffractive structures with a specific diffraction order returns in the beam path of the incoming measurement wave.

In a further embodiment according to the invention, the calibration mask is successively arranged in two different orientations with respect to the measurement wave, in the case of which orientations the measurement wave is reflected with in each case a different diffraction order at the diffractive structures in Littrow reflection. In particular, the calibration mask is successively oriented in such a way that the measurement wave is respectively reflected with a positive and a negative diffraction order in Littrow reflection, the absolute value of the diffraction order being the same in each case. In one embodiment, the calibration mask is successively tilted in such a way that the measurement wave is Littrow-reflected with the +1st and the −1st diffraction order. The positions of the diffractive structures are determined by forming the difference between the interferometric measurements at the different orientations. In accordance with one variant, the calibration mask is thereupon rotated by 90° with respect to its surface normal and the measurement is repeated for both tilting positions. From the measurements of both rotational positions, it is possible to determine the positions of the diffractive structures in two orthogonal coordinate directions.

In a further embodiment according to the invention, a further calibration mask, the diffractive structures of which differ from the diffractive structures of the first calibration mask with regard to their structure type, is provided. The positions of the diffractive structures of the further calibration mask are determined by means of interferometric measurement. Systematic errors are thereupon determined in a manner dependent on the structure type from the positions determined for the diffractive structures of the two calibration masks, and the measured positions of the first calibration mask are corrected by excluding in calculation the systematic errors caused by the structure type of the diffractive structures of the first calibration mask. The corrected positions of the diffractive structures of the first calibration mask are used during the calibration of the apparatus. This makes it possible to increase the calibration accuracy further.

In one embodiment according to the invention, the diffractive structures of the first calibration mask differ from the diffractive structures of the further calibration mask with regard their structure type in that they differ with regard to their geometry and/or size. In a further embodiment according to the invention, the structural difference is produced by virtue of the fact that the diffractive structures on the first calibration mask are produced by means of a first production method and the diffractive structures on the further calibration mask are produced by means of a second production method, which differs from said first production method. Thus, by way of example, the diffractive structures can be produced by electron beam writing in one production method and by holographic exposure in the other production method.

In a further embodiment according to the invention, the measurement structures are formed by the diffractive structures. This ensures that the position measurement of the calibration mask by means of the position measuring apparatus is effected at exactly the same coordinate points as the interferometric position measurement during the qualification of the calibration mask and the position measurement data are thus accurately coordinated with one another. This increases the accuracy of the calibration.

In one embodiment of the calibration mask according to the invention, the diffractive structures are configured for enabling an interferometric measurement of the positions of the diffractive structures with respect to one another with an accuracy of less than 2 nm, that is to say with an accuracy of better than 2 nm, in particular better than 1 nm. In this context, the accuracy can be defined as 3 $\sigma$, that is to say triple the standard deviation of the positions. The standard deviation is calculated from the difference between the measured positions and the respective desired position for all the measurement points on the calibration mask.

In a further embodiment according to the invention, the diffractive structures together cover more than 50%, in particular more than 70%, of the usable mask area. In one embodiment according to the invention, the diffractive structures together cover more than 160 cm$^2$ of a calibration mask designed as a 6 inch mask.

In a further embodiment according to the invention, the calibration mask has at least 1000, in particular at least 2000, of the diffractive structures. It is thus possible to measure at least 1000 measurement points on the calibration mask with regard to their position, whereby the material measure on the mask can be effected with correspondingly high resolution.

In a further embodiment according to the invention, the diffractive structures are respectively configured as diffraction gratings. In one variant, grating elements of the individual diffraction gratings are at a distance of less than 1.5 µm, in particular less than 1 µm, with respect to adjacent grating elements. If the diffractive structures are configured as two-dimensional gratings, for example, then the individual grating elements are formed by the respective grating lines. Adjacent grating elements should then be understood to mean grating lines which have the same orientation and are directly adjacent. In the case where the diffractive structures are configured as checkerboard gratings, the grating elements are squares of a specific type of the checkerboard grating. The distance between the adjacent grating elements then refers to the distance between two squares of this type in the vertical or respectively horizontal direction of the checkerboard pattern.

In a further embodiment according to the invention, grating elements of the individual diffraction gratings are arranged at a period distance of less than 3 µm, in particular of less than 2 µm, with respect to one another. The period distance can also be referred to as "pitch".

In a further embodiment according to the invention, each diffraction grating has at least 100 grating elements, in particular at least 200 or at least 1000 grating elements. This preferably holds true for each dimension of the calibration mask, that is to say for each of the two spatial directions spanning the mask surface. Such a high number of grating elements enables a highly accurate position measurement of the diffractive structures.

In a further embodiment according to the invention, the diffractive structures each have an extent of more than 200 µm, in particular more than 1 mm, in at least one spatial direction. Preferably, the diffractive structures have an extent of more than 200 µm in both spatial directions spanning the mask surface.

In a further embodiment according to the invention, the diffractive structures are configured for reflecting visible light at an angle of incidence of greater than 1°, in particular of greater than 10° or greater than 45°, in Littrow reflection. As an alternative, the diffractive structures can be configured for reflecting UV light at the stated angles of incidence in Littrow reflection.

In a further embodiment according to the invention, as already mentioned above, the diffractive structures can each have a checkerboard grating. In accordance with one variant, said grating has at least 100, in particular at least 1000, grating elements in the shape of reflective square areas per spatial direction of the mask surface.

Furthermore, the diffractive structures can each comprise a plurality of one-dimensional line gratings of differing orientation. Such structures are also referred to as "parquet structures". In one embodiment, these parquet structures have four quadrants, wherein a one-dimensional line grating is in each case arranged in the same orientation in the first and third quadrants, and the second and fourth quadrants in each case have the one-dimensional line grating in an orthogonal orientation with respect to the arrangement in the first and third quadrants. The line length of the line gratings is preferably at least 100 µm, in particular at least 500 µm.

In a further embodiment according to the invention, the diffractive structures comprise a ring grating having a plurality of concentric circles and/or radial lines with respect to a central point. In one variant, the ring grating extends over the entire usable area of the calibration mask. In this case, the diffractive structures form a single ring grating. The concentric circles are preferably not equidistant. In accordance with one variant, the distance between adjacent concentric circles increases linearly with increasing radial distance from the center of the ring grating.

In a further embodiment according to the invention, the diffractive structures are configured for diffracting light in the visible and/or higher-frequency wavelength range. The diffractive structures are thus configured for producing diffraction effects upon interaction with light in the visible and/or higher-frequency wavelength range, in particular at 633 nm, 248 nm or 193 nm.

As already mentioned above, in one embodiment according to the invention, the calibration mask has product structures which are to be imaged lithographically onto a wafer in addition to the diffractive structures. In this case, the calibration mask is embodied as a so-called product mask or useful mask.

In a further embodiment according to the invention, the diffractive structures are in each case computer-generated holograms (CGHs). The structure of such a CGH is initially determined by computer simulation of the interference phenomenon to be generated by the CGH. In this case, the structure of the CGH is optimized in such a way that the interferometric position determination can be effected particularly simply and with high accuracy. The CGH is thereupon produced by lithographic methods, e.g. by electron beam writing, on the calibration mask.

Furthermore, the invention provides a calibration mask set comprising a plurality of the calibration masks mentioned above, wherein the diffractive structures of different calibration masks differ with regard to their structure type. This makes it possible to separate product errors of the diffractive structures from the errors of the interferometric measuring device and thus to exclude the production errors of the diffractive structures from the measurement result in calculation.

As already explained above with regard to the method according to the invention, in accordance with a first variant, the different structure types differ with regard to their geometry and/or size. In accordance with a further variant, the different structure types differ with regard to the method for producing the diffractive structures.

The invention furthermore provides an apparatus for the position measurement of measurement structures on a lithography mask, which is configured for measuring the position of any of the measurement structures with respect to the position of any other measurement structure with an accuracy of less than 1 nm, in particular less than 0.5 nm or less than 0.1 nm. Such an accurately measuring apparatus can be configured by calibration thereof by means of the calibration method according to the invention. In other words, the calibration of a position measuring apparatus by means of a calibration mask qualified by interferometric position measurement according to the invention makes it possible to provide a position measuring apparatus having the abovementioned accuracy. As already defined in the above case, the accuracy can be defined as 3 σ, that is to say triple the standard deviation of the measured positions.

The features specified with regard to the abovementioned embodiments of the calibration method according to the invention can correspondingly be applied to the calibration mask according to the invention or the use according to the invention. Conversely, the features specified with regard to the abovementioned embodiments of the calibration mask according to the invention can be correspondingly applied to the calibration method according to the invention or the use according to the invention.

The invention furthermore provides a method for measuring a mask for microlithography. This method comprises the following steps: providing the mask having diffractive structures arranged thereon, and determining the positions of the diffractive structures with respect to one another by means of interferometric measurement. This measurement method enables a highly accurate position measurement of structures arranged on the mask. One example of the measured mask for microlithography is the calibration mask described above. In particular, it is also possible to measure a product mask having product structures to be imaged onto the wafer.

In one embodiment of the measurement method according to the invention, a measurement wave of an interferometer is radiated onto the mask in such a way that it is reflected in Littrow reflection at the diffractive structures, and the reflected wave is superimposed with a reference wave for producing an interference pattern. In accordance with one variant, the calibration mask is successively arranged in two different orientations with respect to the measurement wave, in the case of which orientations the measurement wave is reflected with in each case a different diffraction order at the diffractive structures in Littrow reflection. Further advantageous embodiments of the measurement method are evident from the embodiments and variants presented with regard to the calibration method according to the invention.

BRIEF DESCRIPTION OF THE DRAWINGS

The above and also further advantageous features of the invention are illustrated in the following detailed description of exemplary embodiments according to the invention with reference to the accompanying schematic drawings, in which.

DETAILED DESCRIPTION OF EXEMPLARY EMBODIMENTS ACCORDING TO THE INVENTION

In the exemplary embodiments described below, elements which are functionally or structurally similar to one another are provided as far as possible with the same or similar reference signs. Therefore, for understanding the features of the individual elements of one specific exemplary embodiment, reference should be made to the description of other exemplary embodiments or the general description of the invention.

Figure 1:
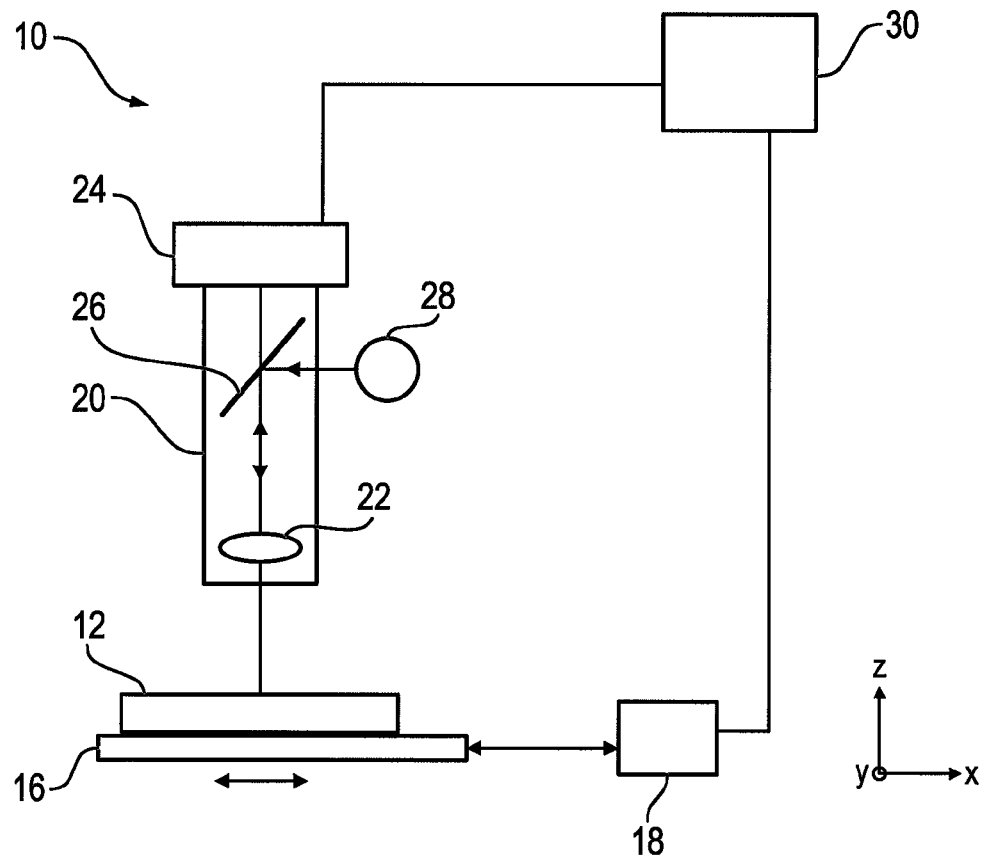
FIG. 1 shows a schematic illustration of an apparatus for the position measurement of measurement structures on a lithography mask.
Figure 2:
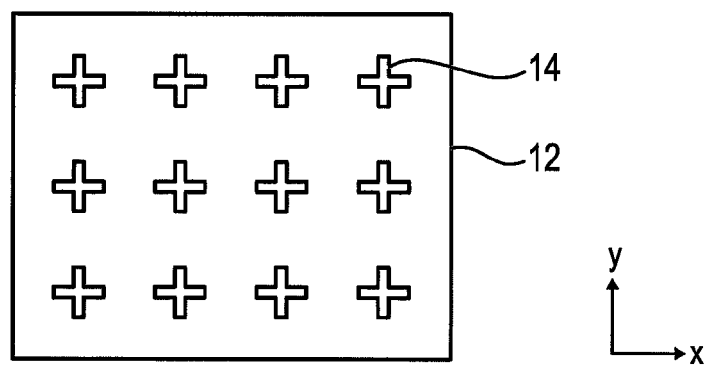
FIG. 2 shows a plan view of such a lithography mask with measurement structures.

FIG. 1 shows an apparatus 10 for the position measurement of measurement structures on a lithography mask 12. FIG. 2 shows a plan view of such a lithography mask 12 with exemplary measurement structures 14 in the shape of alignment marks embodied as cross structures. In the illustration in accordance with FIG. 2, the measurement structures 14 are illustrated in greatly enlarged fashion in relation to the lithography mask 12, for clarification purposes. To facilitate the description, a Cartesian xyz coordinate system is indicated in the drawing, said system revealing the respective positional relationship of the components illustrated in the figures. In FIG. 1, the x-direction runs toward the right, the y-direction runs perpendicularly to the plane of the drawing into the latter, and the z-direction runs upward. Useful structures or product structures to be imaged onto a wafer can also serve, as an alternative, as measurement structures 14. Thus, the measurement structures 14 can for example also be contained as so-called "in-die structures" on the lithography mask 12.

The position measuring apparatus 10, often also referred to as "registration apparatus" or "placement metrology apparatus", comprises a mask holder 16 in the shape of a positioning table, which can be displaced in the x-y plane in accordance with the coordinate system indicated in FIG. 1. Furthermore, the position measuring apparatus comprises distance measuring modules 18 in the shape of length interferometers for determining a travel of the mask holder 16 during a position change thereof.

The position measuring apparatus 10 furthermore comprises a recording device 20, of which a measuring objective 22 and a two-dimensional detector 24 are illustrated schematically here. Furthermore, the recording device 20 comprises a beam spacer 26 and also an illumination source 28, such that the measurement structures 14 on the lithography mask 12 inserted into the mask holder 16 can be recorded with reflected light illumination. The wavelength of the light emitted by the illumination source 28 can be in the visible range, for example approximately 633 nm, or else in the UV range, e.g. 365 nm, 248 nm or 193 nm. In addition to the reflected light illumination illustrated, the position measuring apparatus 10 can also be operated in the transmitted light mode, in which the light from the illumination source 28 is radiated through the lithography mask 12.

During the operation of the position measuring apparatus 10, the individual measurement structures 14 are successively moved into the center of the image field of the recording device 20 by corresponding displacement of the mask holder 16 in the x-y plane. The position of the respective measurement structure 14 is thereupon determined by evaluation of the image recorded by the detector 24 by means of an evaluation module 30. This is done by determining edge threshold values in the image of the respective measurement structure 14 or by means of correlation methods. The distance from the measurement structure 14 respectively measured previously is detected by means of the travel of the mask holder 16 that is detected by means of the length interferometers of the distance measuring module 18. From this information, the positions of the measurement structures 14 with respect to one another on the lithography mask 12 are measured with high accuracy.

Figure 3:
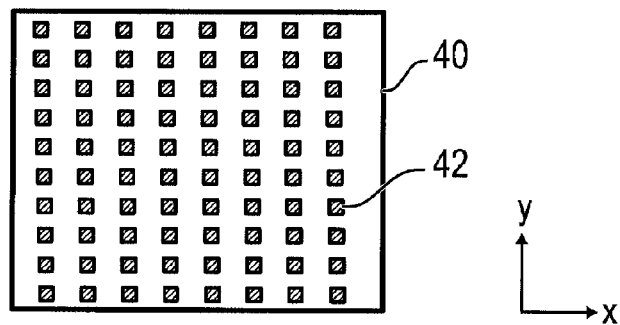
FIG. 3 shows a plan view of a calibration mask according to the invention with a multiplicity of diffractive structures.

In order to further increase the position measurement accuracy of the apparatus 10, according to the invention the calibration mask 40 illustrated in FIG. 3 is firstly qualified by means of a method according to the invention and thereupon used for calibrating the position measuring apparatus 10. This calibration serves, in particular, to eliminate interferometer errors of the distance measuring module 18, such as cosine errors, errors on account of length-dependent beam profiles and also tilting and unevennesses of the interferometer mirrors.

The calibration mask 40 according to the invention comprises a multiplicity of diffractive structures 42 configured for the interferometric position measurement of the diffractive structures 42, as explained in greater detail below. The diffractive structures 42 are distributed in a dense raster over the entire usable area of the calibration mask 40, as illustrated schematically in FIG. 3. In the case of a 6 inch mask, in one variant, more than 1000, preferably more than 2000, diffractive structures 42 of this type are arranged. In this case, all of the diffractive structures 42 taken together cover an area of more than 160 cm$^2$. Appropriate calibration masks 40 include all conventional mask types, in particular masks with resist structures, COG masks, MoSi masks and masks with quartz structures. In one embodiment of the calibration mask 40, the distance between respectively adjacent diffractive structures 42 is less than 1 mm. This facilitates the evaluation of the interferometric measurement. The distance between the diffractive structures 42 can even become zero, in which case the individual diffractive structures merge into one another, such that effectively a substantial region of the calibration mask 40 or even the entire usable mask surface is covered by a diffractive overall structure comprising the individual diffractive structures.

The calibration mask 40 illustrated in FIG. 3 serves exclusively for calibrating the apparatus 10. As an alternative, however, the calibration mask 40 can also be embodied as a product mask or useful mask having so-called product structures in addition to the diffractive structures 42. Such product structures are provided for being imaged onto a wafer by means of a projection exposure apparatus for microlithography. In this case, in particular, the diffractive structures 42 taken together advantageously cover a smaller area than indicated above. In the case, too, in which the calibration mask 40 serves exclusively for calibration, in one embodiment the area covered by the diffractive structures 42 can be smaller than indicated above.

Figure 4:
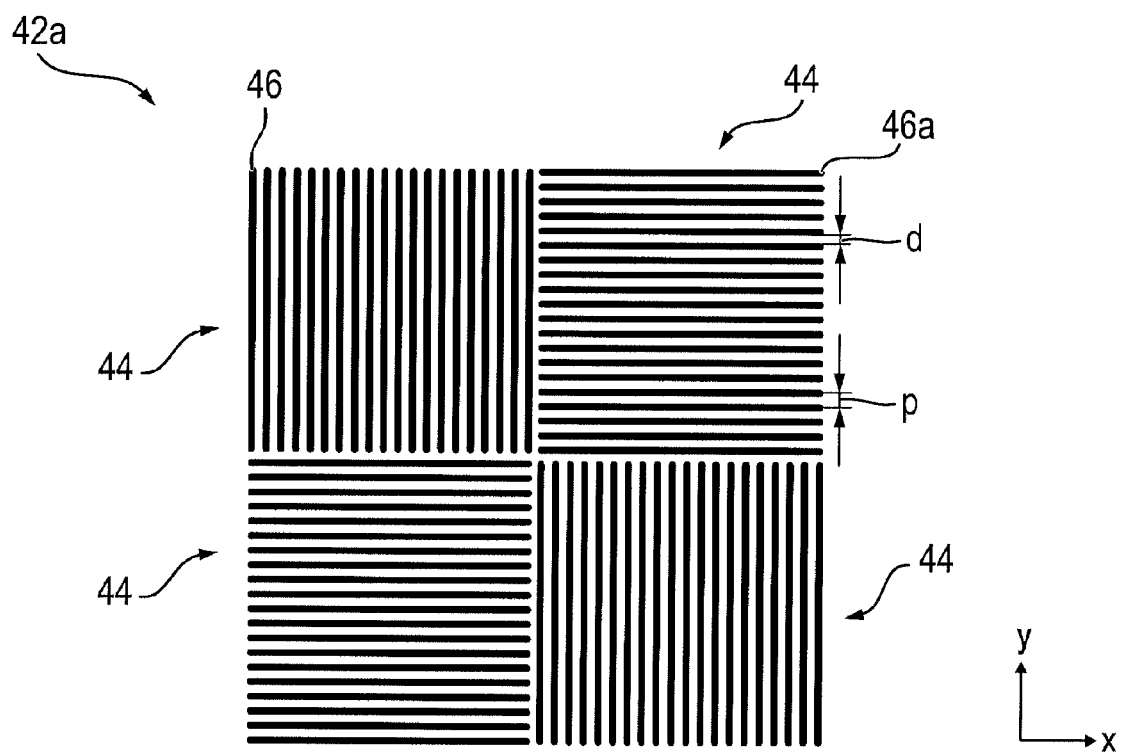
FIG. 4 shows a basic illustration of a first embodiment according to the invention of a diffractive structure in accordance with FIG. 3.

FIG. 4 shows a first embodiment of a diffractive structure 42 in accordance with FIG. 3 in the shape of a so-called parquet structure 42a. The parquet structure 42a has four quadrants, each having a reflective one-dimensional line grating 44. In this case, the line gratings 44 of two diagonally opposite quadrants are oriented horizontally, while the line gratings 44 of the two remaining quadrants are oriented vertically. FIG. 4 illustrates the parquet structure 42a in a representative fashion. In one preferred embodiment according to the invention, the line gratings 44 comprise significantly more structure elements 46a in the shape of lines than are shown in FIG. 4, namely preferably 100 to 200 lines per line grating 44. The length of said lines is greater than 100 µm. The parquet structures 42a thus extend over more than 200 µm, typically over more than 1000 µm, both in the x-direction and in the y-direction. The distance d between the individual lines 46a is less than 1.5 µm, in particular approximately 1 µm. The period distance, also called pitch p, is less than 3 µm, in particular less than 2 µm. The parquet structure 42a is thus designed for the diffraction of visible light, wherein a Littrow reflection with first diffraction order can be produced at an angle of incidence of greater than 1°

Littrow reflection is understood to mean, as illustrated in greater detail below, that a specific diffraction order of an incident wave diffracted with reflection at a diffractive structure returns in the beam path of the incident wave.

Figure 5:
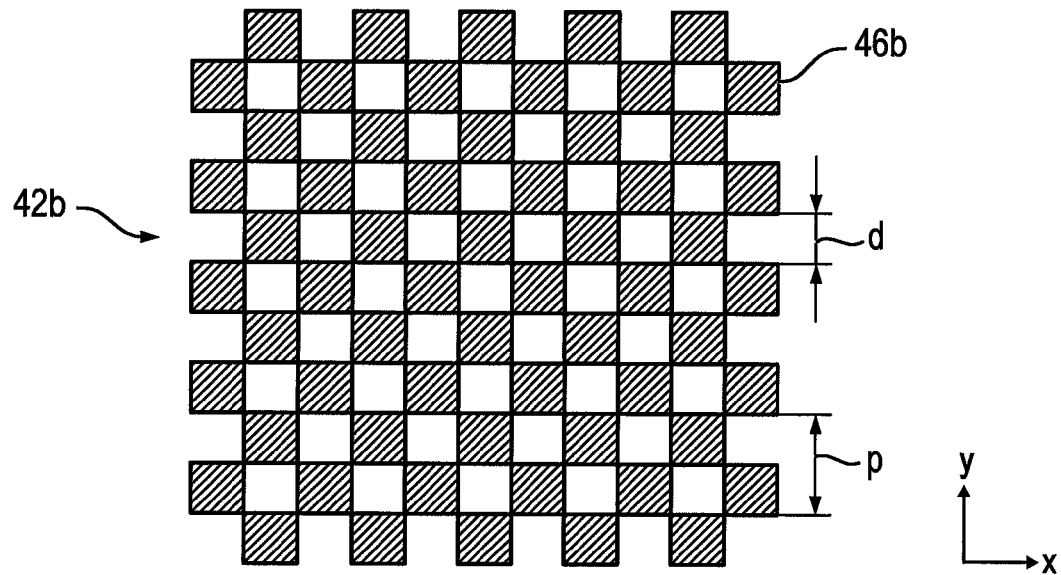
FIG. 5 shows a basic illustration of a second embodiment according to the invention of a diffractive structure in accordance with FIG. 3.

FIG. 5 illustrates a further embodiment of a diffractive structure 40 according to FIG. 3 in the shape of a checkerboard grating 42b. In the embodiment according to the invention, the checkerboard grating 42b preferably likewise contains a large number of structure elements in the shape of reflective square areas 46b. In one embodiment according to the invention, the number of square areas 46b per diffractive structure is at least 100, in particular at least 1000, both in the x-direction and in the y-direction, and is thus significantly larger than is illustrated in representative fashion in FIG. 5. The distance d between individual square areas, analogously to the distance d in accordance with FIG. 4, is preferably less than 1.5 µm, in particular less than 1 µm, both in the vertical direction and in the horizontal direction. The checkerboard grating 42b preferably has a minimum extent of 1 mm both in the x-direction and in the y-direction.

Figure 6:
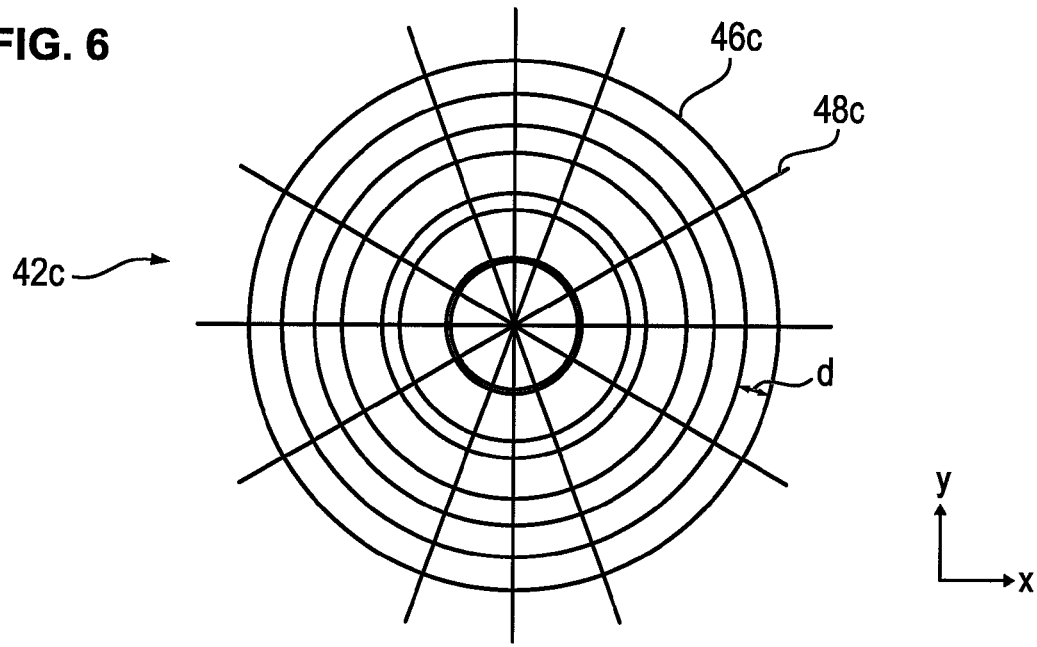
FIG. 6 shows a basic illustration of a third embodiment according to the invention of a diffractive structure in accordance with FIG. 3.

FIG. 6 shows a ring grating 42c as a further possibility of the configuration of the diffractive structures 42. Unlike the illustration shown in FIG. 3, the ring grating 42c extends over the entire mask area of the calibration mask 40. The individual diffractive structures 42 in accordance with FIG. 3 thus merge into one another and are formed by the ring grating 42c. The ring grating 42c comprises structure elements in the shape of reflective concentric circles 46c and also reflective radial lines 48c with respect to the central point of the ring grating 42c. Depending on the required position information, the ring grating 42c can also comprise only the concentric circles 46c or only the radial lines 48c. The distance d between the concentric circles 46c is not necessarily equidistant; in accordance with one variant, said distance decreases linearly or quadratically with increasing radial distance from the center of the ring grating. The average distance d between individual concentric circles 46c is between 1 and 100 µm.

The diffractive structures in accordance with FIGS. 4 to 6 are produced, in accordance with one embodiment according to the invention, by interferometric or holographic exposure with a plurality of plane waves, spherical waves or other arbitrary, but defined waves. High-order aberrations can thus be prevented from arising. As an alternative, the diffractive structures can also be produced by means of an electron beam writer on the calibration mask 40. The diffractive structures 42 can also have more complex forms than as shown in FIGS. 4 to 6. In particular, the diffractive structures 42 can be configured as computer-generated holograms (CGHs).

Figure 7:
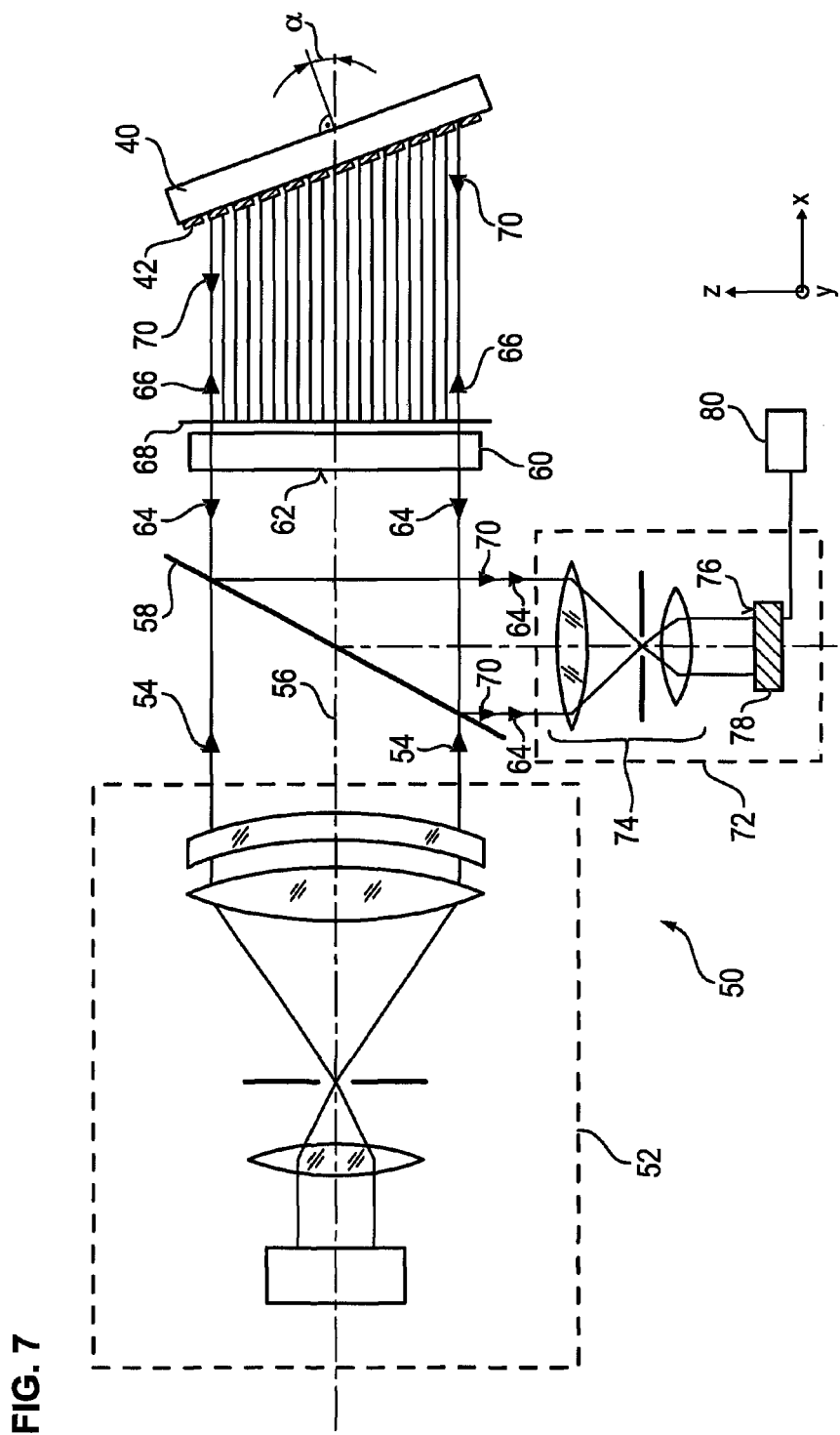
FIG. 7 shows a sectional view of an interferometer for the measurement according to the invention of the calibration mask in accordance with FIG. 3.

FIG. 7 illustrates an interferometer 50 for qualifying the calibration mask 40. The interferometer 50 comprises a light source 52, a beam splitter 58 and also an interferometer camera 72. The light source 52 generates illumination radiation 54. The illumination radiation 54 has sufficiently coherent light for carrying out an interferometric measurement. The illumination radiation 54 can be generated by means of a helium-neon laser, for example, and thus have a wavelength of approximately 633 nm. As an alternative, however, the illumination radiation 54 can also be provided in all other wavelength ranges, in particular also in the UV wavelength range, e.g. at 365 nm, 248 nm or 193 nm. The illumination radiation 54 is generated by the light source 52 with a substantially plane wavefront, propagates along an optical axis 56 of the interferometer 50 and passes through the beam splitter 58.

The illumination radiation 54 thereupon impinges on a Fizeau element 60 having a Fizeau surface 62. Part of the illumination radiation 54 is reflected at the Fizeau surface 62 as a reference wave 64. That part of the illumination radiation 54 which passes through the Fizeau element 60 propagates as incoming measurement wave 66 having a plane wavefront 68 further along the optical axis 56 and impinges on the surface of the calibration mask 40. The calibration mask 40 is successively arranged in two different tilting positions with respect to the optical axis 56.

Figure 8:
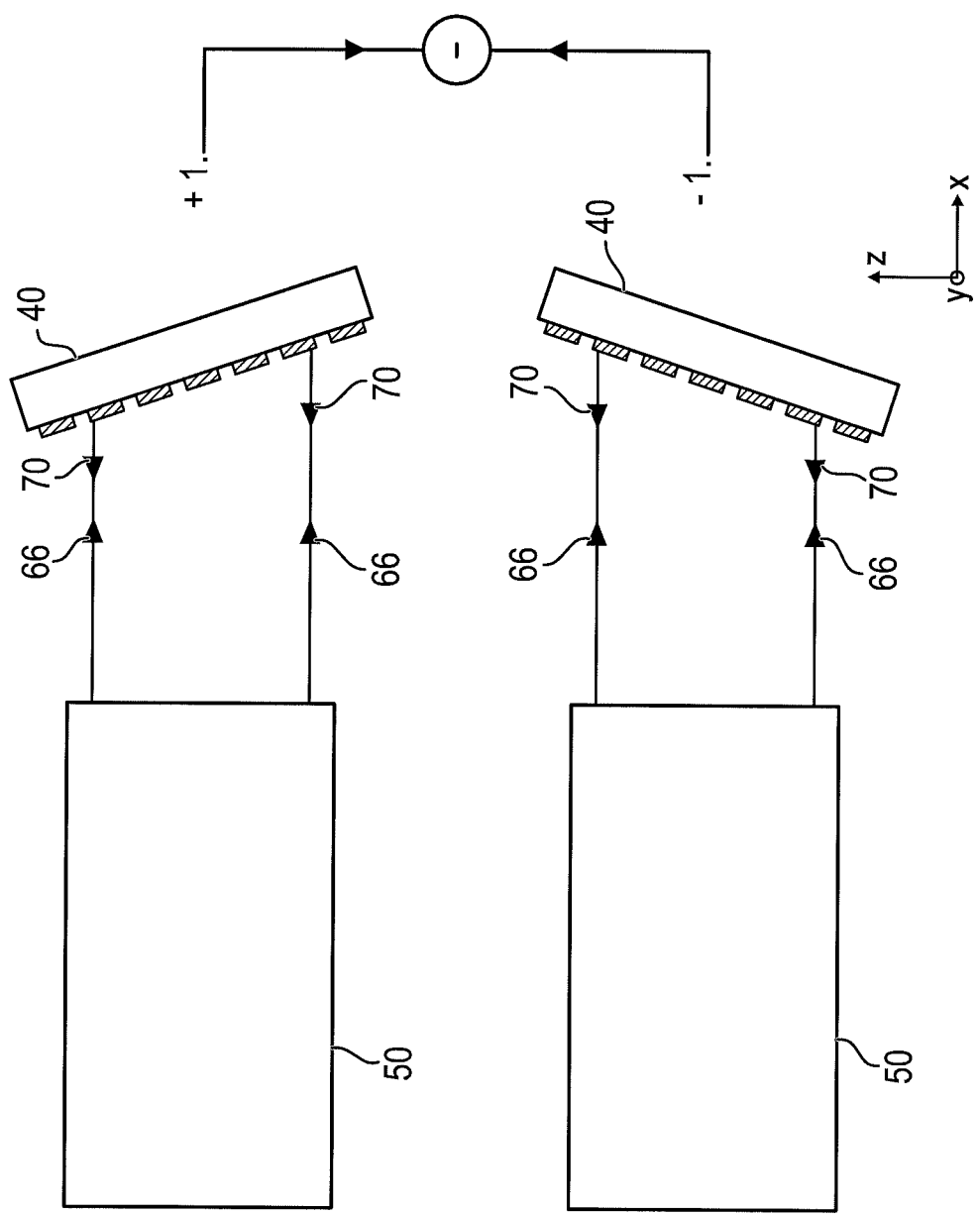
FIG. 8 shows an illustration of different tilting positions of the calibration mask during the measurement thereof according to the invention by means of the interferometer in accordance with FIG. 7.

FIG. 8 illustrates these two tilting positions, wherein the tilting position illustrated in the upper region of the figure corresponds to the tilting position of the calibration mask 40 in accordance with FIG. 7. In this tilting position, the tilting angle α between the normal to the surface of the calibration mask 40 and the optical axis 56 is set in such a way that the incoming measurement wave 66 is Littrow-reflected with plus first diffraction order at the diffractive structures 42 of the calibration mask 40. That is to say that the first diffraction order of the measurement wave reflected at the diffractive structures 42 returns as reflected wave 70 in the beam path of the incoming measurement wave 66. The reflected wave 70 is directed onto the interferometer camera 72 by the beam splitter 58. The reflected wave 70 is imaged by said camera onto a detection surface 76 of a camera chip 78 by means of an objective system 74. An interference pattern arises on the detection surface 76 as a result of superimposition with the reference wave 64, said interference pattern being stored by an evaluation module 80. From the interference pattern, it is possible to determine deviations of the wavefront of the reflected wave 70 from the wavefront of the reference wave 64 and thus to measure the wavefront of the reflected wave.

As already mentioned above, the calibration mask 40 is thereupon brought to the tilting position shown in the lower region of FIG. 8, in which tilting position the measurement wave 66 is Littrow-reflected at the diffractive structures 42 with minus first diffraction order. The interference pattern generated by superimposition of the wave 70 reflected with minus first diffraction order with the reference wave 64 on the detection surface 76 of the camera chip 78 is likewise read in by the evaluation module 80.

The evaluation module 80 evaluates the interferograms generated in the two tilting positions of the calibration mask 40 by forming the difference between the two interferograms. This results in the x-coordinates of the individual diffractive structures 42 on the calibration mask 40 relative to one another.

The coordinates determined are, in particular, the coordinates of the respective centroids of the diffractive structures 40 weighted with regard to the diffractive effect of the individual structure elements of the diffractive structures 40. For a symmetrical diffractive structure, this weighted centroid coincides with the geometrical centroid of the geometrical structure. If these coordinates are compared with predetermined desired distances of the diffractive structures 42 with respect to one another, it is possible to determine the position errors of the diffractive structures 42 with regard to their x-coordinate.

The calibration mask 40 is thereupon rotated by 90° with respect to its surface normal and the measurement is repeated for both tilting positions in accordance with FIG. 8. From the resulting interferograms, the evaluation module 80 calculates the y-components of the positions of the diffractive structures 42 on the calibration mask 40. The corresponding y-components of the position errors of the diffractive structures 42 are calculated therefrom in turn.

The interferometric position measurement of the diffractive structures 42 according to the invention enables a higher accuracy by comparison with a conventional position measurement of measurement structures by image detection. This higher accuracy results from the fact that an averaging of the positions of the individual structure elements 46a, 46b and 46c, respectively, is effected during the interferometric measurement. In the case in which a diffractive structure 42 has a constant position error for all the structure elements, an offset arises for the interferometrically determined position of the diffractive structure 42, which offset can be correspondingly taken into account in the subsequent calibration of the position measuring apparatus 10. For this purpose, the position errors of the individual structure elements of a diffractive structure 42 must be small relative to the required measurement accuracy. If this is not the case, it is possible, as an alternative, to use the above-explained weighted centroid over a plurality of structure elements, also referred to as ensemble value. According to the invention, the application of the interferometric position measuring method described above is not restricted to a calibration mask. Thus, product masks can also be provided with diffractive structures 42 and be measured by means of the interferometric position measuring method.

By means of the above-described qualification of the calibration mask 40, a set of position errors of the diffractive structures 42 arranged on the calibration mask 40 is determined with a high accuracy. The calibration mask 40 qualified in this way is thereupon inserted into the position measuring apparatus 10 instead of the lithography mask 12 shown in FIG. 1, and the calibration mask 40 is correspondingly measured by the position measuring apparatus 10. The positions of measurement structures arranged on the calibration mask 40 with respect to one another are measured in this case. The measurement structures can be arranged in addition to the diffractive structures 42, e.g. in the form of crosses, in accordance with FIG. 2, on the calibration mask 40. As an alternative, however, the diffractive structures 42 themselves can also function as measurement structures. In this case there is a 1:1 correspondence of the interferometrically measured position errors of the diffractive structures 42 to the position errors measured by the position measuring apparatus.

The position measuring apparatus 10 is thereupon calibrated on the basis of the interferometrically measured error set and also the positions determined by means of the position measuring apparatus 10 itself. In this case, deviations of the position measurements effected by means of the position measuring apparatus 10 from the positions determined by the interferometric measurement with high accuracy on the calibration mask 40 are compared and a corresponding calibration data record for the correction of data records subsequently determined during the measurement of lithography masks is determined.

In a further embodiment according to the invention, not just a single calibration mask 40 but an entire calibration mask set of such calibration masks 40 is used during the calibration of the position measuring apparatus 10. The individual calibration masks 40 differ with regard to the structure type of the diffractive structures 42 arranged thereon. The difference in the structure type can relate to the geometry, size or the method for production of the diffractive structures 42.

Thus, the diffractive structures 42 of a first calibration mask 40 can be embodied for example as parquet structures 42a in accordance with FIG. 4, while on a second calibration mask 40 the diffractive structures 42 are embodied in the shape of the checkerboard grating illustrated in FIG. 5. A third calibration mask can be equipped with the ring gratings 42c in accordance with FIG. 6, for example. Further calibration masks can contain diffractive structures 42 having a geometry already used on another calibration mask, but with a different scaling.

Furthermore, the calibration masks can differ in that the diffractive structures were produced by different production methods. Thus, on a first calibration mask the diffractive structures can be produced by electron beam writing, for instance, while the production of the diffractive structures on another calibration mask is effected by interferometric/holographic exposure with a plurality of plane waves. If the position errors of the individual diffractive structures for the different calibration masks 40 are then qualified by means of the interferometric method described above, then it is possible to separate typical production errors of the diffractive structures 42 from errors of the measuring apparatus 10.

LIST OF REFERENCE SIGNS

10 Position measuring apparatus
12 Lithography mask
14 Measurement structure
16 Mask holder
18 Distance measuring module
20 Recording device
22 Measuring objective
24 Detector
26 Beam splitter
28 Illumination source
30 Evaluation module
40 Calibration mask
42 Diffractive structure
42a Parquet structure
42b Checkerboard grating
42c Ring grating
44 One-dimensional line grating
46a Line
46b Square area
46c Circle
48c Radial line
50 Interferometer
52 Light source
54 Illumination radiation
56 Optical axis
58 Beam splitter
60 Fizeau element
62 Fizeau surface
64 Reference wave
66 Incoming measurement wave
68 Plane wavefront
70 Reflected wave
72 Interferometer camera
74 Objective system
76 Detection surface
78 Camera chip
80 Evaluation module

The invention claimed is:

1. A calibration mask for calibrating an apparatus for the position measurement of measurement structures on a lithography mask, wherein the calibration mask comprises diffractive structures configured for the interferometric position measurement of the diffractive structures.

2. The calibration mask according to claim 1, wherein the diffractive structures are configured for enabling an interferometric measurement of the positions of the diffractive structures with respect to one another with an accuracy of less than 2 nm.

3. The calibration mask according to any of the preceding claim 1, wherein the diffractive structures together cover more than 50% of the usable mask area.

4. The calibration mask according to claim 1, which has at least 1000 of the diffractive structures.

5. The calibration mask according to claim 1, wherein the diffractive structures are respectively configured as diffraction gratings.

6. The calibration mask according to claim 5, wherein grating elements of the individual diffraction gratings are at a distance of less than 1.5 µm with respect to adjacent grating elements.

7. The calibration mask according to claim 5, wherein grating elements of the individual diffraction gratings are arranged at a period distance of less than 3 µm with respect to one another.

8. The calibration mask according to claim 5, wherein each diffraction grating has at least 100 grating elements.

9. The calibration mask according to claim 1, wherein the diffractive structures each has an extent of more than 200 µm in at least one spatial direction.

10. The calibration mask according to any of the preceding claim 1, wherein the diffractive structures are configured for reflecting visible light at an angle of incidence of greater than 1° in Littrow reflection.

11. The calibration mask according to claim 1, wherein the diffractive structures each has a checkerboard grating.

12. The calibration mask according to claim 1, wherein the diffractive structures each comprises a plurality of one-dimensional line gratings of differing orientation.

13. The calibration mask according to claim 1, wherein the diffractive structures comprise a ring grating having a plurality of concentric circles and/or radial lines with respect to a central point.

14. The calibration mask according to claim 1, wherein the diffractive structures are configured for diffracting light in the visible and/or higher-frequency wavelength range.

15. The calibration mask according to claim 1, which has product structures which are to be imaged lithographically onto a wafer in addition to the diffractive structures.

16. A calibration mask set comprising a plurality of calibration masks according to claim 1, wherein the diffractive structures of different calibration masks differ with regard to their structure type.

17. The calibration mask set according to claim 16, wherein the different structure types differ with regard to their geometry and/or size.

18. The calibration mask set according to claim 16, wherein the different structure types differ with regard to the method for producing the diffractive structures.

19. The calibration mask set according to claim 18, wherein the diffractive structures of a first structure type are produced by electron beam writing and the diffractive structures of a second structure type are produced by holographic exposure.

20. An arrangement comprising an apparatus for the position measurement of measurement structures on a lithography mask and also a calibration mask according to claim 1.

21. A use of a calibration mask comprising diffractive structures arranged thereon for the calibration of an apparatus for the position measurement of measurement structures on a lithography mask, wherein the diffractive structures are configured for the interferometric position measurement of the diffractive structures.

22. The use of a calibration mask according to claim 21, wherein the calibration mask is configured for calibrating an apparatus for the position measurement of measurement structures on a lithography mask, and the calibration mask comprises diffractive structures configured for the interferometric position measurement of the diffractive structures.

23. A method for calibrating an apparatus for the position measurement of measurement structures on a lithography mask, comprising the following steps:
    qualifying a calibration mask comprising diffractive structures arranged thereon by determining positions of the diffractive structures with respect to one another by means of interferometric measurement,
    determining positions of measurement structures arranged on the calibration mask with respect to one another by means of the apparatus, and
    calibrating the apparatus by means of the positions determined for the measurement structures and also the positions determined for the diffractive structures.

24. The method according to claim 23, wherein, when qualifying the calibration mask, a measurement wave of an interferometer is radiated onto the calibration mask in such a way that it is reflected in Littrow reflection at the diffractive structures, and the reflected wave is superimposed with a reference wave for generating an interference pattern.

25. The method according to claim 24, wherein the calibration mask is successively arranged in two different orientations with respect to the measurement wave, in the case of which orientations the measurement wave is reflected with in each case a different diffraction order at the diffractive structures in Littrow reflection.

26. The method according to claim 23, wherein a further calibration mask, the diffractive structures of which differ from the diffractive structures of the first calibration mask with regard to their structure type, is provided, the positions of the diffractive structures of the further calibration mask are determined by means of interferometric measurement, systematic errors are determined in a manner dependent on the structure type from the positions determined for the diffractive structures of the two calibration masks, the measured positions of the first calibration mask are corrected by excluding in calculation the systematic errors caused by the structure type of the diffractive structures of the first calibration mask, and the corrected positions of the diffractive structures of the first calibration mask are used during the calibration of the apparatus.

27. The method according to claim 26, wherein the diffractive structures of the first calibration mask differ from the diffractive structures of the further calibration mask with regard to their geometry and/or size.

28. The method according to claim 26, wherein the diffractive structures on the first calibration mask are produced by means of a first production method and the diffractive structures on the further calibration mask are produced by means of a second production method, which differs from said first production method.

29. The method according to claim 28, wherein the diffractive structures are produced by electron beam writing in one of the production methods and the diffractive structures are produced by holographic exposure in the other production method.

30. The method according to claim 23, wherein the measurement structures are formed by the diffractive structures.

31. The method according to claim 23, wherein the calibration mask is configured for calibrating an apparatus for the position measurement of measurement structures on a lithography mask, and the calibration mask comprises diffractive structures configured for the interferometric position measurement of the diffractive structures.

32. A method for measuring a mask for microlithography, comprising the following steps:
    providing the mask having diffractive structures arranged thereon, and
    determining the positions of the diffractive structures with respect to one another by means of interferometric measurement.

33. The method according to claim 32, wherein a measurement wave of an interferometer is radiated onto the mask in such a way that it is reflected in Littrow reflection at the diffractive structures, and the reflected wave is superimposed with a reference wave for producing an interference pattern.

* * * * *

UNITED STATES PATENT AND TRADEMARK OFFICE
CERTIFICATE OF CORRECTION

| | | |
|---|---|---|
| PATENT NO. | : 8,617,774 B2 | Page 1 of 1 |
| APPLICATION NO. | : 13/266920 | |
| DATED | : December 31, 2013 | |
| INVENTOR(S) | : Norbert Kerwien et al. | |

It is certified that error appears in the above-identified patent and that said Letters Patent is hereby corrected as shown below:

In the Claims

Column 14

Line 24, in Claim 3, after "according to" delete "any of the preceding".

Line 45, in Claim 10, after "according to" delete "any of the preceding".

Signed and Sealed this
Twenty-ninth Day of April, 2014

Michelle K. Lee
*Deputy Director of the United States Patent and Trademark Office*